(12) United States Patent
Moon et al.

(10) Patent No.: US 7,886,208 B2
(45) Date of Patent: Feb. 8, 2011

(54) LDPC DECODING APPARATUS AND METHOD BASED ON NODE MEMORY

(75) Inventors: June Moon, Seoul (KR); Seul-Ki Bae, Suwon-si (KR); Soon-Young Yoon, Seoul (KR)

(73) Assignee: Samsung Electronics Co., Ltd (KR)

( * ) Notice: Subject to any disclaimer, the term of this patent is extended or adjusted under 35 U.S.C. 154(b) by 1042 days.

(21) Appl. No.: 11/702,015

(22) Filed: Feb. 2, 2007

(65) Prior Publication Data
US 2007/0220398 A1    Sep. 20, 2007

(30) Foreign Application Priority Data
Feb. 2, 2006    (KR)    ............. 10-2006-0010263

(51) Int. Cl.
    H03M 13/00    (2006.01)
(52) U.S. Cl. .................. 714/752; 714/796; 714/799
(58) Field of Classification Search ............ 714/752, 714/796, 799
    See application file for complete search history.

(56) References Cited

U.S. PATENT DOCUMENTS

| 7,398,455 | B2 * | 7/2008 | Eroz et al. | 714/780 |
| 7,415,079 | B2 * | 8/2008 | Cameron et al. | 375/340 |
| 7,436,902 | B2 * | 10/2008 | Shen et al. | 375/308 |
| 7,499,490 | B2 * | 3/2009 | Divsalar et al. | 375/240 |
| 7,516,390 | B2 * | 4/2009 | Shen et al. | 714/755 |
| 2005/0283707 | A1 | 12/2005 | Sharon et al. | |

FOREIGN PATENT DOCUMENTS

| CN | 1713530 | 12/2005 |
| EP | 1 610 466 | 6/2005 |
| JP | 2005-045735 | 2/2005 |
| KR | 1020050021108 | 3/2005 |
| KR | 1020050046471 | 5/2005 |

OTHER PUBLICATIONS

Lechner et al., "Efficient DSP Implementation of an LDPC Decoder", IEEE Int. Conf. on Acoustics, Speech, and Signal Processing, ICASSP '04, May 17-21, 2004.

* cited by examiner

*Primary Examiner*—Esaw T Abraham
(74) *Attorney, Agent, or Firm*—The Farrell Law Firm, LLP

(57) ABSTRACT

An apparatus is provided for decoding a Low-Density Parity Check (LDPC) code in a communication system. In the LDPC decoding apparatus, an edge memory stores a message delivered through an edge between a variable node and a check node. A node memory stores a node value. A node processor performs a node processing operation using information stored in at least one of the node memory and the edge memory, stores a check node value generated by performing the node processing operation in the node memory, and stores a message generated by performing the node processing operation in the edge memory. A switch switches outputs of the node memory and the node processor through a permutation operation. A parity check verifier parity-checks an output from the node memory. A controller provides a control signal for controlling the node processor.

33 Claims, 10 Drawing Sheets

LDPC DECODING APPARATUS AND METHOD BASED ON NODE MEMORY

PRIORITY

This application claims priority under 35 U.S.C. §119(a) to an application entitled "LDPC Decoding Apparatus And Method Based On Node Memory" filed in the Korean Intellectual Property Office on Feb. 2, 2006 and assigned Serial No. 2006-10263, the entire contents of which are incorporated herein by reference.

BACKGROUND OF THE INVENTION

1. Field of the Invention

The present invention relates generally to a Low-Density Parity Check (LDPC) decoder, and in particular, to an efficient LDPC decoding apparatus and method based on a node memory structure.

2. Description of the Related Art

The LDPC code, first provided by Gallager and restudied by MacKay, has recently attracted attention as a code that can show superior performance approaching the Shannon's capacity limit by belief propagation decoding based on a sum-product algorithm.

Thereafter, Richardson et al. proposed a density evolution technique that pursues a change in probability distribution of messages generated and updated during a decoding process in a factor graph constituting an LDPC code. In addition, for infinite iteration in a cycle-free factor graph, Richardson et al. proposed degree distribution of variable and check nodes in a factor graph, which can maximize a channel parameter (for example, threshold) capable of making error probability converge at 0. Further, Richardson et al. have theoretically shown that such a case can be applied even to a finite-length LDPC code having cycles. Richardson et al. also have shown that theoretical channel capacity of an irregular LDPC code can approach the Shannon's capacity limit by up to 0.0045 dB with the use of the density evolution technique.

The LDPC code may increase in complexity of a coding/decoding process, because its performance increases as a packet size increases. Recently, Flarion Company has proposed a multi-edge type vector LDPC code that can be implemented at low hardware complexity even for a large packet size. The vector LDPC code, for example, Block LDPC (BLDPC) code, is a code for which an efficient coder/decoder can be implemented through parallel implementation of a vectorized structure even with a small-sized base H matrix, for example, a check matrix. The parallel implementation due to parallel factors of the BLDPC code is being discussed as a possible alternative to the base codes in the next generation mobile communication system in which a data rate increases sharply, because the BLDPC code, compared with other codes, for example, turbo code and convolutional code, enables implementation of a higher-throughput decoder.

The LDPC code is a special case of the general linear block codes, and is defined as a parity check matrix.

FIG. 1 is a diagram illustrating a Tanner graph and a parity check matrix of a general LDPC code. In FIG. 1, there are shown a Tanner graph and a parity check matrix H for 2 information bits and 3 parity bits.

Referring to FIG. 1, in the Tanner graph, variable nodes indicate bits of a codeword, and check nodes indicate one check equation. Therefore, the number N of the variable nodes indicates a length of the codeword, i.e. a column size of the H matrix, and the number R of the check nodes indicates the number of parity bits, i.e. a row size of the H matrix.

Therefore, shown in FIG. 1 is an example of a rate=$\tfrac{2}{5}$ LDPC code. An edge for connecting the nodes in the Tanner graph is indicated by '1' in the H matrix.

FIG. 2 is a diagram illustrating an operation of a general message-passing decoder.

Referring to FIG. 2, a decoder for a general LDPC code can be described with a message-passing concept in a bipartite graph, and the decoder operates in an iterative calculation method through exchange of messages, i.e. extrinsic information, between variable nodes and check nodes as shown in FIG. 2.

As shown in FIG. 2, $m_{j,i}^{VC}$ denotes a message delivered from a $j^{th}$ variable node to an $i^{th}$ check node, and is generated through an operation of a variable node processor. In addition, $m_{i,j}^{VC}$ denotes a message delivered from an $i^{th}$ check node to a $j^{th}$ variable node, and is generated through an operation of a check node processor.

In the known sum-product algorithm, generation of each message can be expressed as set forth in Equation (1) and Equation (2):

$$m_{j,i}^{VC} = y_j + \left( \sum_{\substack{k \in C(j) \\ k \neq j}} m_{k,j}^{VC} \right), \quad (1)$$

$$p_{i,j}^{CV} = \prod_{k \in V(i), k \neq i} F(p_{k,i}^{VC})$$

$$q_{i,j}^{CV} = F^{-1}\left( \sum_{k \in V(i), k \neq i} F(q_{k,i}^{VC}) \right), \quad (2)$$

Equation (1) indicates an expression for message generation of a variable node processor, and Equation (2) indicates an expression for message generation of a check node processor.

As shown in Equation (1), $y_j$ denotes a Log-Likelihood Ratio (LLR) corresponding to a $j^{th}$ variable node, i.e. $j^{th}$ received bit, C(j) denotes an index set of check nodes connected to a $j^{th}$ variable node, and V(i) denotes an index set of variable nodes connected to an $i^{th}$ check node.

As shown in Equation (2), p denotes a sign, for example, +1 or −1, of a message m, and q denotes amplitude of a message m, F(x)=−log(tan h(x/2)) for x>=0, and F(x)=+log(tan h(−x/2)) for x<0.

The general LDPC decoder operating with the message-passing algorithm decodes information bits through the iterative calculation process.

The block LDPC code can be found through expansion of the base H matrix, and a description thereof will be made below with reference to FIG. 3.

FIG. 3 is a diagram illustrating a graph and a parity check matrix of a general block LDPC code.

Referring to FIG. 3, there are shown a graph and a parity check matrix of an H matrix obtained by expanding the H matrix used in FIG. 1 by the number, Z=2, of parallel factors. For Z=2, a length of the codeword is expended twice in FIG. 3. In this case, the expanded H matrix can be expressed as a matrix in which each element in the existing base H matrix is a Z×Z matrix.

As shown in the left-hand side of FIG. 3, when the H matrix shown in FIG. 1 is simply expanded, an identity matrix (I) is located in a position of '1'. In this case, however, because there is no information exchange between layers in the graph, it is not possible to obtain a coding gain corresponding to an increase in the codeword length. Therefore, as shown in the right-hand side of FIG. 3, connection of the edges is arbitrarily made between layers through edge permutation. This is equivalent to using a permutation matrix instead of the identity matrix in the place corresponding to the position of '1' in the base H matrix. As described above, in the block LDPC, a decoder can increase the throughput because it can perform parallel processing in units of Z, thereby contributing to a reduction in the control overhead.

Meanwhile, when exchanging node messages, the decoder generates V2C messages of edges, i.e. outgoing messages of variable nodes, and generates C2V messages, i.e. outgoing messages of check nodes.

A general message-passing decoder can operate regardless of an update order of edge messages. A scheme of determining the update order of edge messages is called a scheduling scheme, and this affects a convergence rate based on iteration of the decoder.

The generally used scheduling scheme is classified into a flooding scheduling scheme and a serial scheduling scheme. The flooding scheduling scheme updates all C2V messages after updating all V2C messages, and the serial scheduling scheme performs a node-based operation.

In addition, the serial scheduling scheme can be divided into a variable node-based serial scheduling scheme and a check node-based serial scheduling scheme. The check node-based serial scheduling scheme first updates incoming messages (i.e. V2C messages) necessary for updating outgoing messages (i.e. C2V messages) connected to one check node. After updating all of the outgoing messages connected to one check node, the check node-based serial scheduling scheme shifts to the next check node and then performs the update, repeating this operation. The variable node-based serial scheduling scheme can also perform the similar operation.

FIG. 4 is a diagram illustrating a structure of a conventional decoder.

Referring to FIG. 4, there is shown a conventional decoder implemented with one Vector Node Processor (VNP) and one Vector Edge Message Memory (VMM).

The VNP includes at least one node processor unit, and each node processor unit performs Z calculations. In addition, the VNP can perform variable node or check node calculations according to a control signal. The decoder should be able to store both of V2C and C2V messages with one VMM. Therefore, only the flooding scheduling scheme can be applied to this structure.

For example, when the VNP first starts an operation as a variable node processor, C2V messages have been stored in the VMM. Therefore, in order to update outgoing messages (i.e. V2C messages) for first variable nodes, the VNP reads C2V messages stored in the VMM, calculates outgoing messages, and then stores the V2C messages in a memory address on which the read operation was performed.

After the calculation on all the variable nodes is performed, all messages in the VMM are updated as the V2C messages. Thereafter, the VNP performs an operation of a check node processor according to a control signal. That is, in order to store and process both of the V2C and C2V messages with one memory per edge, only the flooding scheduling technique is possible.

In addition, a switching device existing between the VNP and the VMM performs, for example, edge permutation between layers as described in FIG. 3.

In this case, the conventional decoder, as it performs calculations sequentially with one VNP, has a small memory size and simple hardware, but it has low decoder throughput. A detailed description thereof will be made later with reference to FIGS. 6A and 6B.

FIG. 5 is a diagram illustrating another structure of a conventional decoder. In particular, FIG. 5 shows the structure of a decoder with 2 VNPs.

As illustrated in FIG. 5, each VNP serves as only one of a variable node processor and a check node processor, and the conventional decoder can improve decoding throughput as the two processors simultaneously operate. Similarly, the switching device existing between the VNP and the VMM performs, for example, edge permutation between layers as described in FIG. 3. However, the decoder having the structure as shown in FIG. 5 needs separate memories for storing the C2V messages and the V2C messages. Therefore, the memory is doubled compared with that of the structure show in FIG. 4, i.e. the hardware is doubled, causing an increase in the physical size.

Therefore, there is a need for a decoder capable of achieving higher throughput with lower complexity, and for a design and implementation method thereof.

SUMMARY OF THE INVENTION

An aspect of the present invention is to address at least the problems and/or disadvantages and to provide at least the advantages described below. Accordingly, an aspect of the present invention is to provide a decoding apparatus and method capable of achieving higher throughput with lower complexity of a decoder.

Another aspect of the present invention is to provide a node memory-based LDPC decoding apparatus and method capable of reducing use of a memory, compared with separately using a message memory, and of achieving higher throughput while using a node processor.

According to an aspect of the present invention, there is provided an apparatus for decoding a Low-Density Parity Check (LDPC) code in a communication system. The LDPC decoding apparatus includes an edge memory for storing a message delivered through an edge between a variable node and a check node; a node memory for storing a check node value; a node processor performing a node processing operation using information stored in at least one of the node memory and the edge memory, storing a check node value generated by performing the node processing operation in the node memory, and storing a message generated by performing the node processing operation in the edge memory; a switch for switching outputs of the node memory and the node processor through a permutation operation; a parity check verifier for parity-checking an output from the node memory; and a controller for providing a control signal for controlling the node processor.

According to another aspect of the present invention, there is provided an apparatus for decoding a Low-Density Parity Check (LDPC) code in a communication system. The LDPC decoding apparatus includes a node memory for storing a check node value; a node processor for performing a node processing operation, and generating a check node value stored in the node memory according to the node processing operation; and a switch located between the node memory and the node processor, for switching outputs of the node memory and the node processor through a permutation operation.

According to further another aspect of the present invention, there is provided a method for decoding a Low-Density Parity Check (LDPC) code in a communication system. The LDPC decoding method includes initializing a variable node, a check node and an edge; updating at least one message among messages of the nodes and the edge, with previously updated edge and node message values; and storing the updated edge message or the updated node message.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

Preferred embodiments of the present invention will now be described in detail with reference to the accompanying drawings. In the following description, a detailed description of known functions and configurations incorporated herein has been omitted for clarity and conciseness.

The present invention provides a scheme and apparatus for implementing a decoder that performs message-passing decoding with a variable node-based serial scheduling scheme. In particular, the present invention is a scheme that uses one V2C message memory and uses no separate C2V edge message memory, and the scheme uses a check node memory that is different from the C2V message memory.

The check node memory according to the present invention stores a predetermined representative value for every check node, and the number of memory elements is equal to the number of the check nodes.

Figure 1:
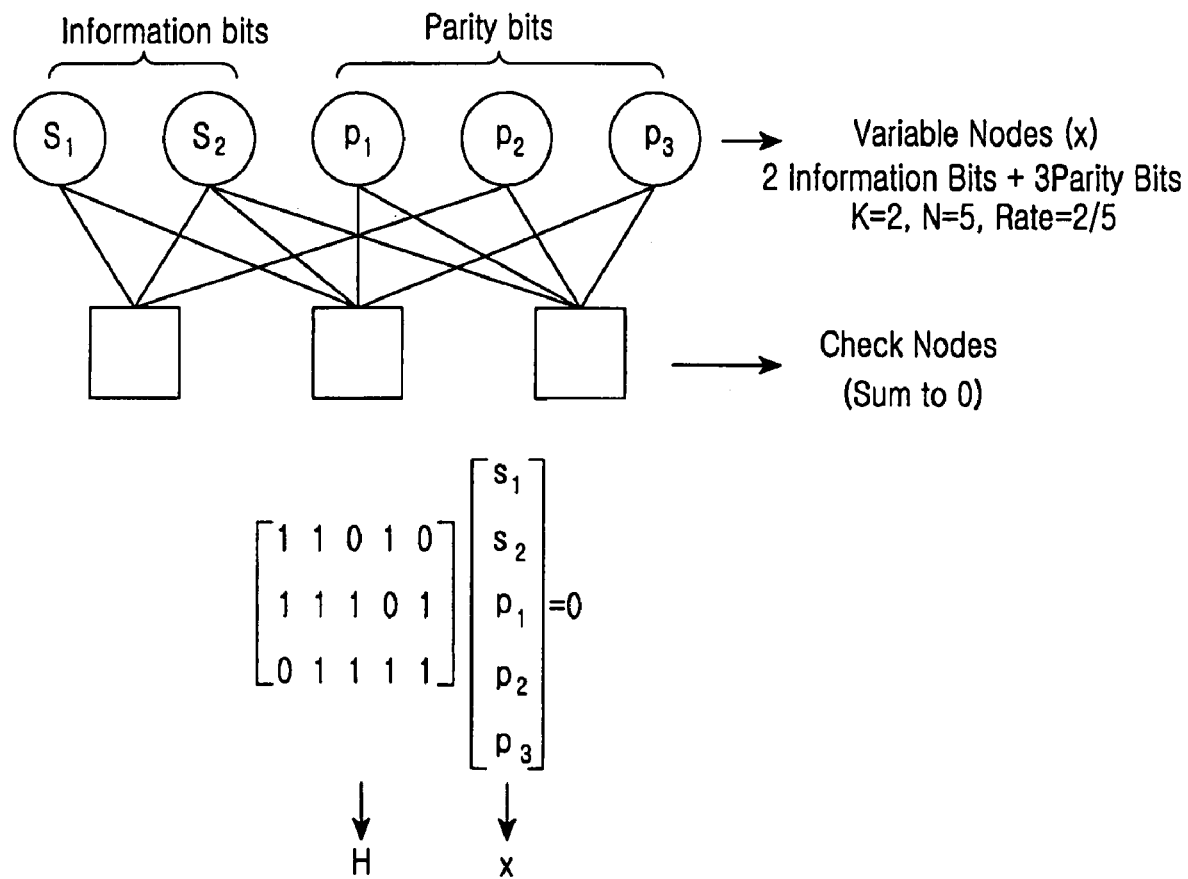
FIG. 1 is a diagram illustrating a Tanner graph and a parity check matrix of a general LDPC code.
Figure 2:
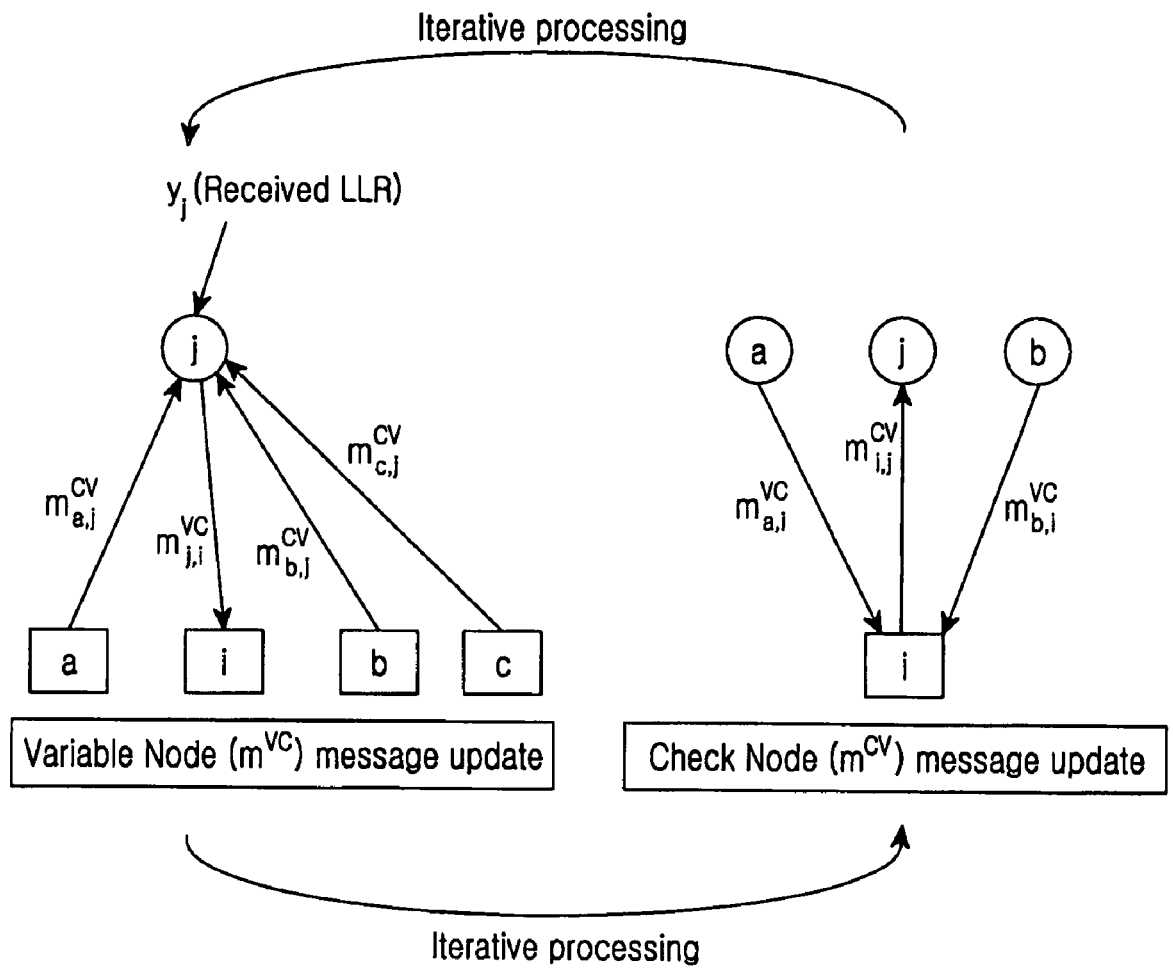
FIG. 2 is a diagram illustrating an operation of a general message-passing decoder.
Figure 3:
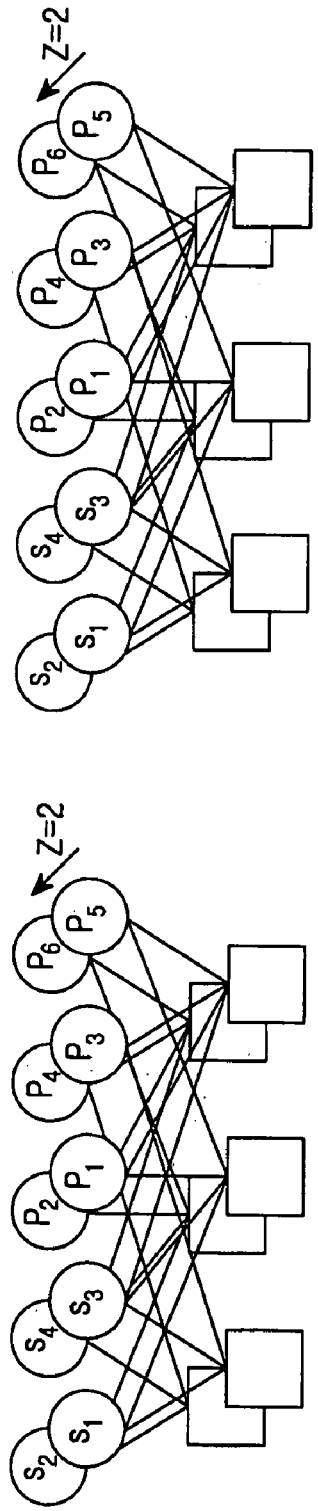
FIG. 3 is a diagram illustrating a graph and a parity check matrix of a general block LDPC code.
Figure 4:
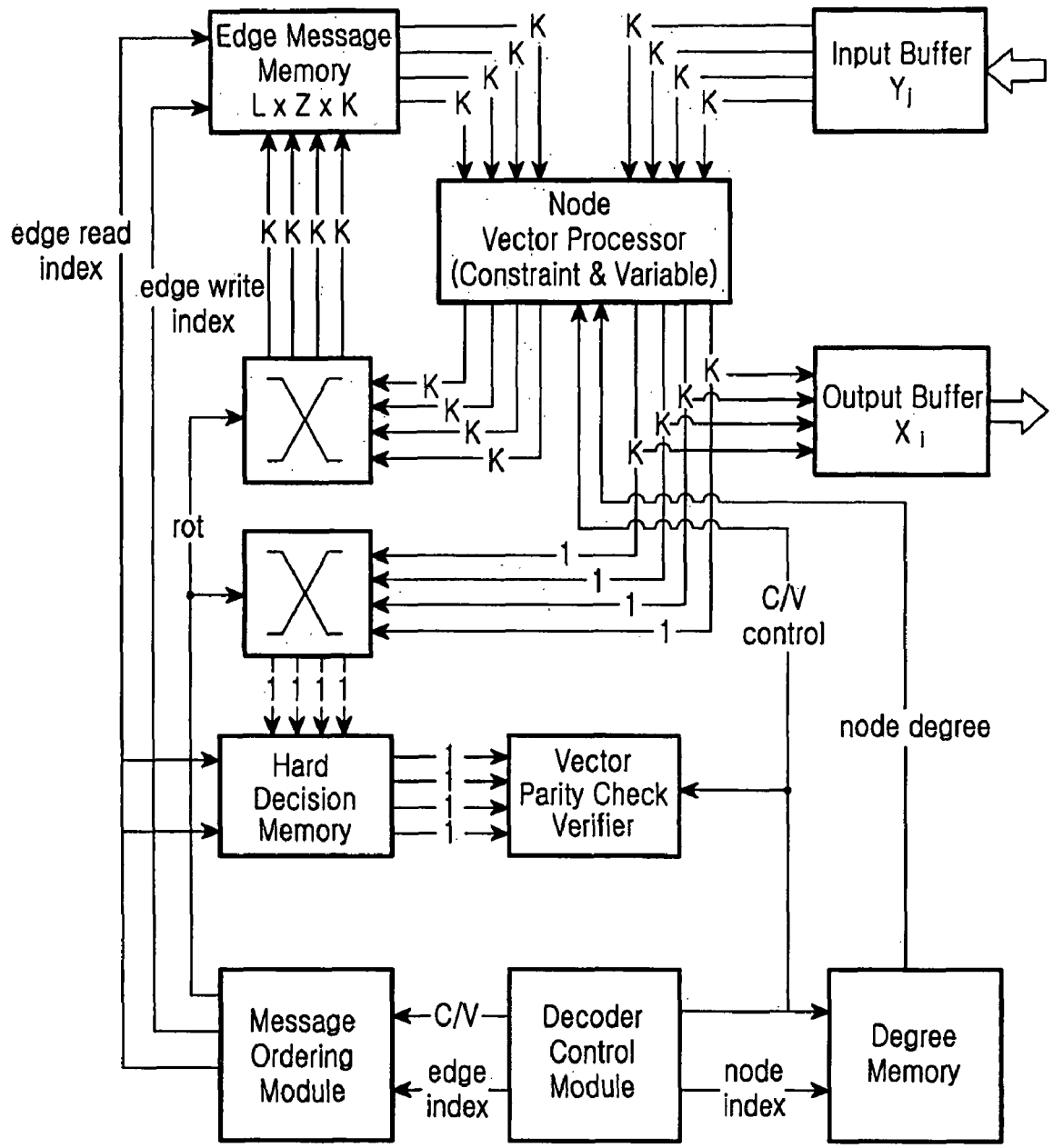
FIG. 4 is a diagram illustrating a structure of a conventional decoder.
Figure 5:
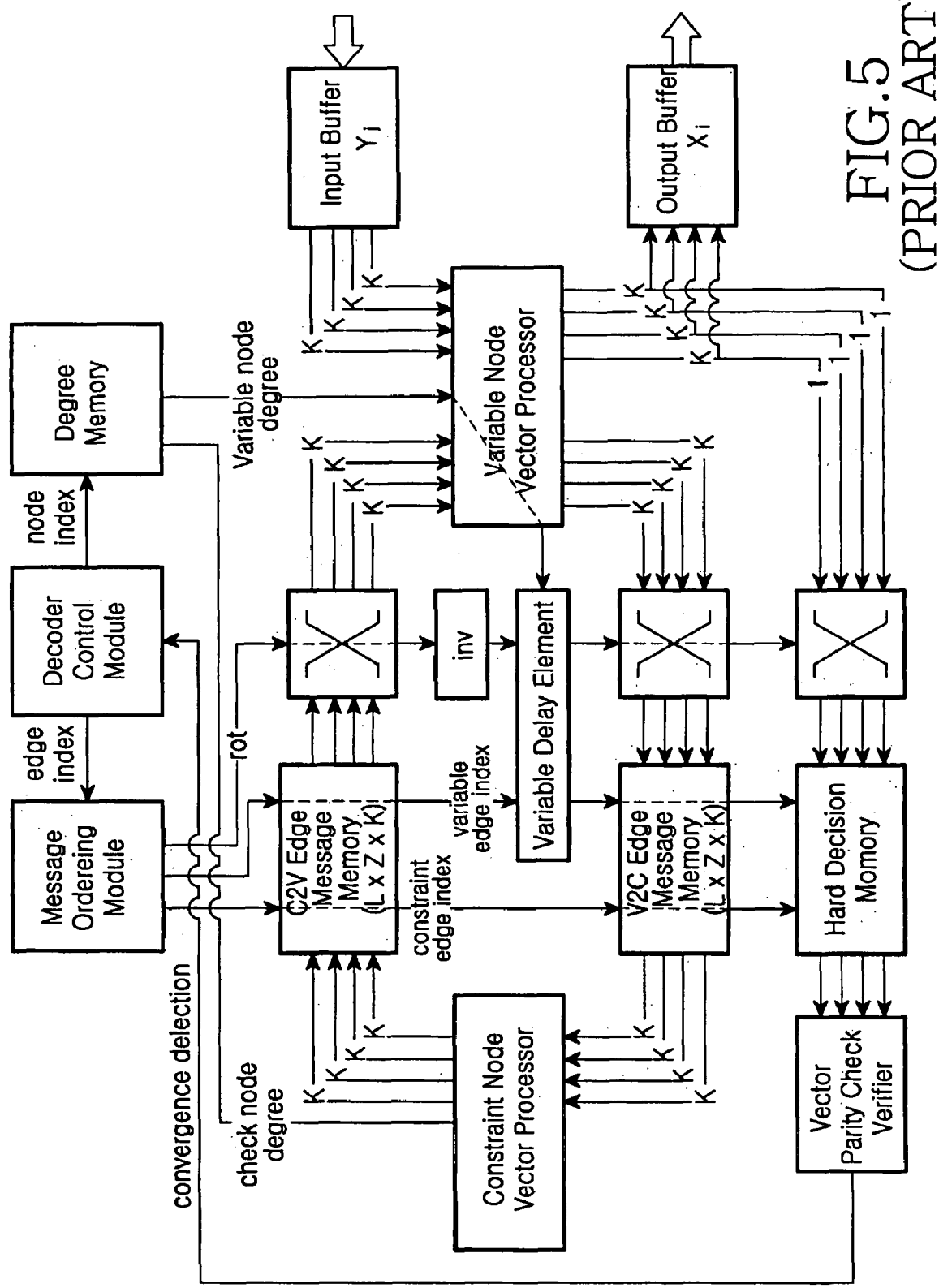
FIG. 5 is a diagram illustrating another preferred structure of a conventional decoder.

Therefore, the present invention can reduce use of the memory, compared with separately using the V2C and C2V edge message memories as described in FIG. 5. In addition, according to the present invention, in order to update V2C messages, a variable node processor generates associated C2V messages on an on-demand basis. In this manner, the new decoder, compared with the decoder of FIG. 4, can achieve high throughput with only one Vector Node Processor (VNP).

As described above, the present invention provides a scheme and apparatus for implementing a decoder that performs message-passing decoding with a variable node-based serial scheduling scheme, and preferred operations of the provided decoder will now be described with reference to the accompanying drawings.

Before providing a description of the present invention, an operation of the existing decoder will be described with reference to FIGS. 6A and 6B.

Figure 6A:
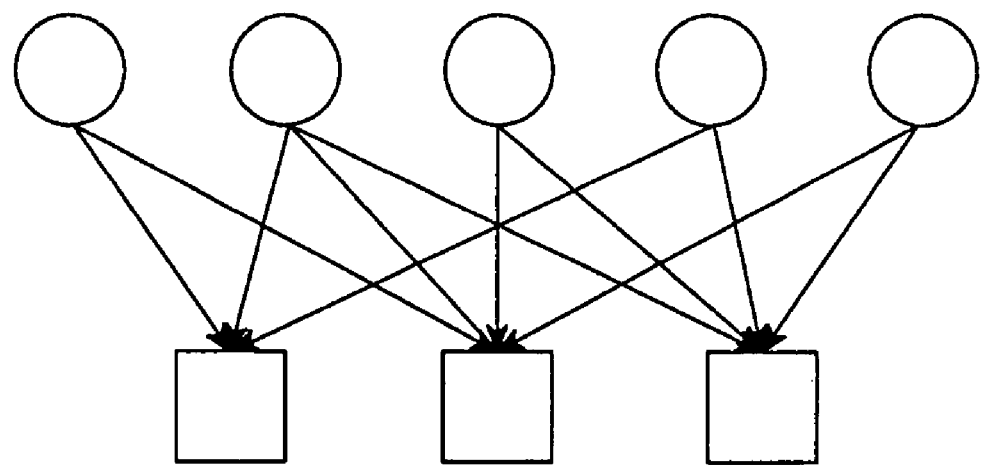
FIGS. 6A and 6B are diagrams illustrating a flooding scheduling scheme used in a general decoder.
Figure 6B:
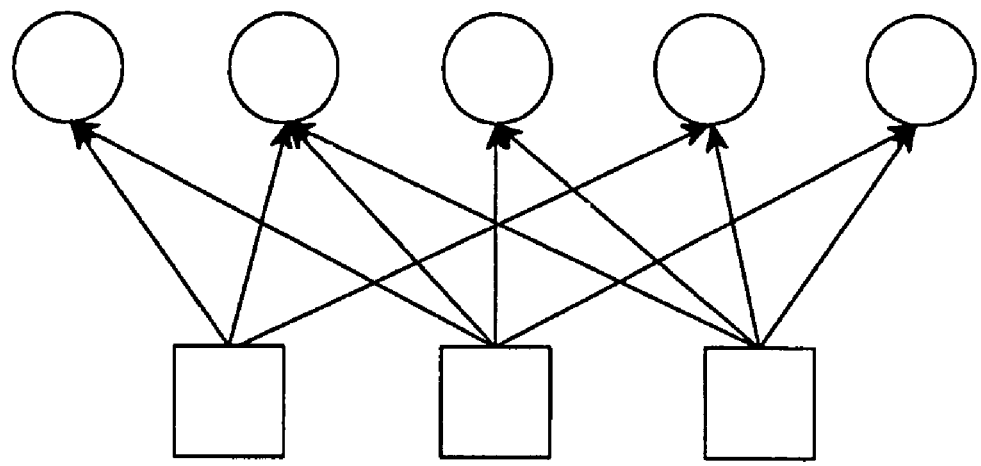

FIGS. 6A and 6B are diagrams illustrating a flooding scheduling scheme used in a general decoder.

Referring to FIGS. 6A and 6B, in the conventional flooding scheduling scheme, variable node processors (i.e., for V2C message generation) and check node processors (i.e., for C2V message generation) operate sequentially. That is, the decoder first entirely updates V2C messages of all edges as shown in FIG. 6A, and thereafter updates all C2V messages as shown in FIG. 6B.

When exchanging variable node values and check node values, this structure does not use values of other nodes. For example, when generating V2C messages, the variable node processors use C2V messages, and the then-used C2V messages are messages which were updated by check node processors of a previous iteration. That is, the conventional technology cannot update C2V messages using the V2C messages first updated in the process of updating V2C messages.

FIGS. 7A to 7F are diagrams illustrating a node memory-based serial scheduling scheme used in a decoder according to the present invention.

Figure 7A:
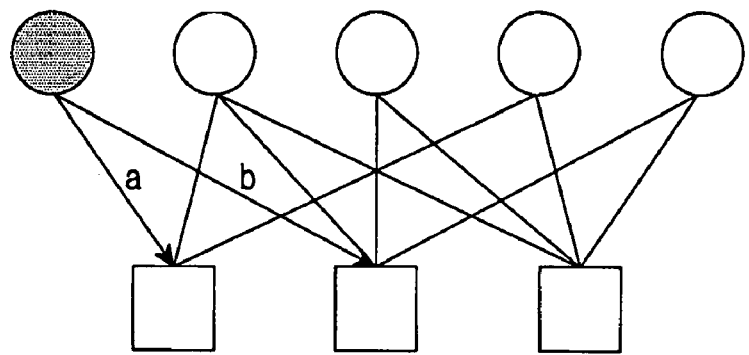
FIGS. 7A to 7F are diagrams illustrating a node memory-based serial scheduling scheme used in a decoder according to the present invention.

Referring to FIGS. 7A to 7F, an LDPC decoding method according to the present invention first updates associated messages using updated messages, thereby improving performance, i.e. convergence rate, of the decoder. That is, when updating V2C messages of a first variable node as shown in FIG. 7A, the LDPC decoding method should previously acquire C2V messages of edges (e.g., edges 'a' and 'b') connected to the first variable node.

Figure 7B:
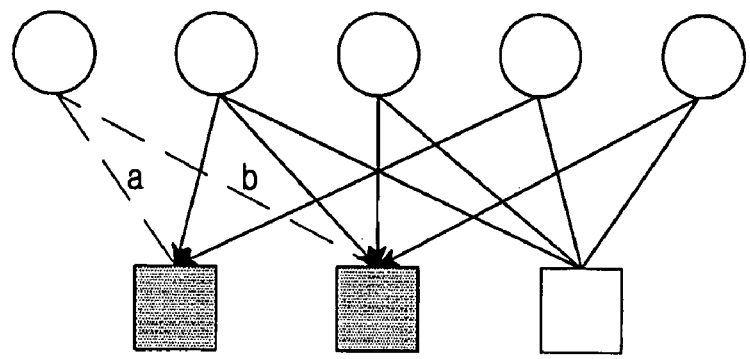

To acquire C2V messages related to the first variable node, as shown in FIG. 7B, the LDPC decoding method generates messages through operations of first and second check node processors in order to update C2V messages of the edges 'a' and 'b' (i.e., indicated by dotted lines) connected to the variable nodes.

Figure 7C:
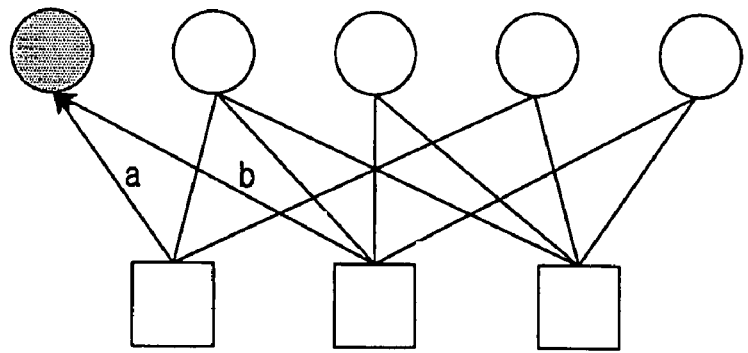
Figure 7D:
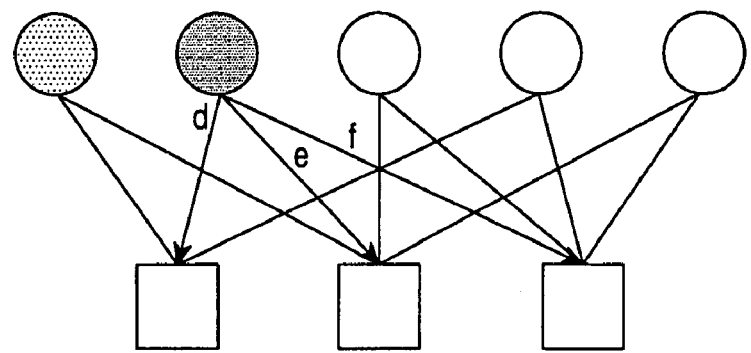

Thereafter, as shown in FIG. 7C, the LDPC decoding method acquires C2V messages of edge 'a' and 'b', and generates V2C messages connected to the edges 'a' and 'b' through the acquired C2V messages of the nodes 'a' and 'b'. Next, as shown in FIG. 7D, in order to generate V2C messages of edges (e.g., edges 'd', 'e' and 'f') connected to a second variable node, the LDPC decoding method acquires C2V messages of the edges. An operation of acquiring the C2V messages is similar to the operation of FIG. 7A, and the LDPC decoding method previously acquires C2V messages of the edges 'd', 'e' and 'f' connected to the second variable node.

Figure 7E:
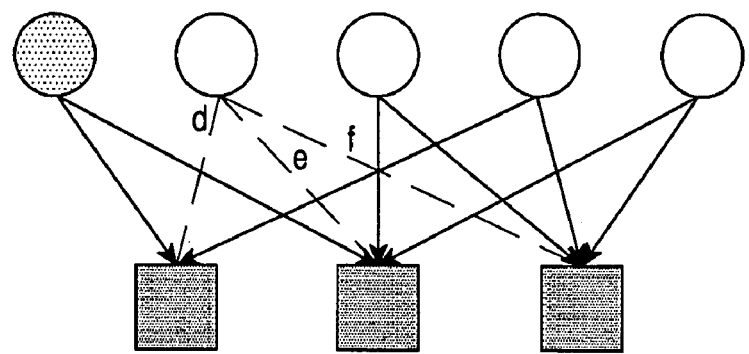

FIG. 7E shows operations of associated check node processors in order to update C2V messages of the edges 'd', 'e' and 'f' connected to the second variable node. Here, the updated V2C messages from the first variable node are used for generating C2V messages of the edges 'd' and 'e'.

Figure 7F:
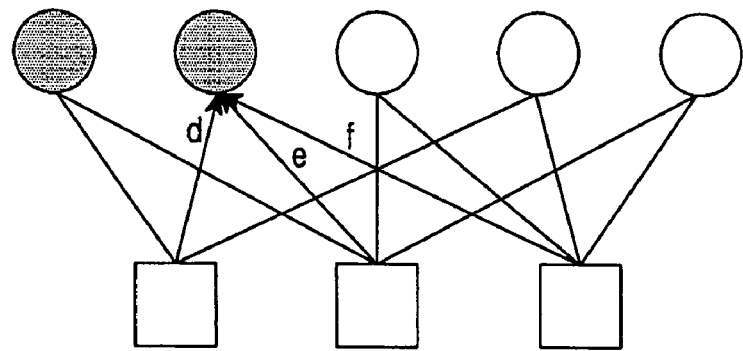

As a result, as shown in FIG. 7F, the LDPC decoding method acquires all the related C2V messages of edge 'd', 'e' and 'f', and generates V2C messages of the edges 'd', 'e' and 'f' through the updated C2V messages.

In the present invention, if V2C messages associated with all variable nodes are entirely updated in the methods shown in FIGS. 7A to 7F, C2V messages are also updated automatically. In the LDPC decoding method of the present invention, C2V messages are generated on an on-demand basis to generate V2C messages of variable nodes. That is, because the V2C messages updated immediately, previously in the message-passing process, are used for generating the C2V messages on an on-demand basis, a convergence rate of the messages increases. This procedure can be expressed as set forth in Equation (3) and Equation (4).

$$m_{v,c}^{VC} \leftarrow y_v, \quad \text{for all } v \text{ and } c \in C(v), \qquad (3)$$

$$q_c \leftarrow \sum_{v \in V(c)} F(|m_{v,c}^{VC}|), \quad \text{for all } c$$

$$p_c \leftarrow \prod_{v \in V(c)} \text{sgn}(m_{v,c}^{VC}) \quad \text{for all } c$$

for all v, (4)

$$L \leftarrow y_v + \sum_{c \in C(v)} F^{-1}(m_c - F(m_{v,c}^{VC}))$$

for all $c \in C(v)$ $$q_{tmp} \leftarrow q_c - F(|m_{v,c}^{VC}|)$$

$$p_{tmp} \leftarrow p_c \cdot \text{sgn}(|m_{v,c}^{VC}|)$$

$$m_{v,c}^{VC} \leftarrow L - F^{-1}(q_{tmp} p_{tmp})$$

$$q_c \leftarrow q_{tmp} + F(|m_{v,c}^{VC}|)$$

$$p_c \leftarrow p_{tmp} \cdot \text{sgn}(m_{v,c}^{VC})$$

end
end

Equation (3) and Equation (4) indicate an initialization stage and an iteration stage, respectively, in an LDPC decoding method according to the present invention.

As shown in Equation (3) and Equation (4), v and c denote a variable node and a check node, respectively, $q_c$ denotes magnitude of a node memory value $m_c$, $p_c$ denotes a sign of a node memory value $m_c$, V(c) denotes an index set of variable nodes adjacent to a $c^{th}$ check node, and C(v) denotes an index set of check nodes adjacent to a $v^{th}$ variable node, $\text{sgn}(x)=-1$ for x<0, and $\text{sgn}(x)=+1$ for $x \geq 0$.

In the initialization stage shown in Equation (3), $m_{vc}$ is initialized to $y_v$, which is an input Log-Likelihood Ratio (LLR). Herein, $m_{vc}^{VC}$ denotes a message delivered from a $v^{th}$ variable node to a $c^{th}$ check node, where v and c are subscripts. After initialization of the $m_{vc}$, the $q_c$ and $p_c$ are initialized independently as shown in Equation (3).

Next, in the iteration stage shown in Equation (4), L denotes a process of adding up all incoming messages of a variable node v, and the incoming messages of the variable node v are composed of $y_v$, which is input LLRs, and C2V messages.

Next, $F^{-1}(q_c-F(|m_{v,c}^{VC}|))$ denotes a C2V message delivered from a $c^{th}$ check node to a $v^{th}$ variable node.

Referring to Equation (3) and Equation (4), a description will be made of a node update method of the present invention. That is, the scheduling scheme of the present invention is a serial scheduling scheme, which is different from the existing flooding scheduling scheme, and the serial scheduling scheme updates $m_{vc}$ every time. That is, a description will herein be made of a method for updating all check nodes connected to each variable node through a scheme, i.e. the serial scheduling scheme, of updating check nodes on the basis of a variable node.

In order to update the $m_{vc}$, incoming edge values are removed from L. Accordingly, there is a need for a part for removing magnitude values and sign values of corresponding edges, and this can be expressed as set forth in Equation (5).

$$m_{v,c}^{VC} \leftarrow L - F^{-1}(q_{tmp} p_{tmp}) \qquad (5)$$

After updating the $m_{vc}$, the node update method of the presented invention reflects amplitude values and sign values of check node memory values to which a corresponding edge is connected. Herein, the node update method stores V2C messages separately. However, for C2V messages, the node update method stores only the representative values $q_c$ and $p_c$ corresponding to each check node, instead of separately storing the C2V messages.

As can be appreciated from the foregoing description, a node processor according to the present invention calculates C2V messages from check node memory values $p_c$ and/or $q_c$ on an on-demand basis in order to generate and store outgoing messages, i.e. V2C messages, for a particular variable node. This is a type of a unified node processing scheme, in which C2V and V2C messages are simultaneously generated and updated in one node processing process.

Figure 8:
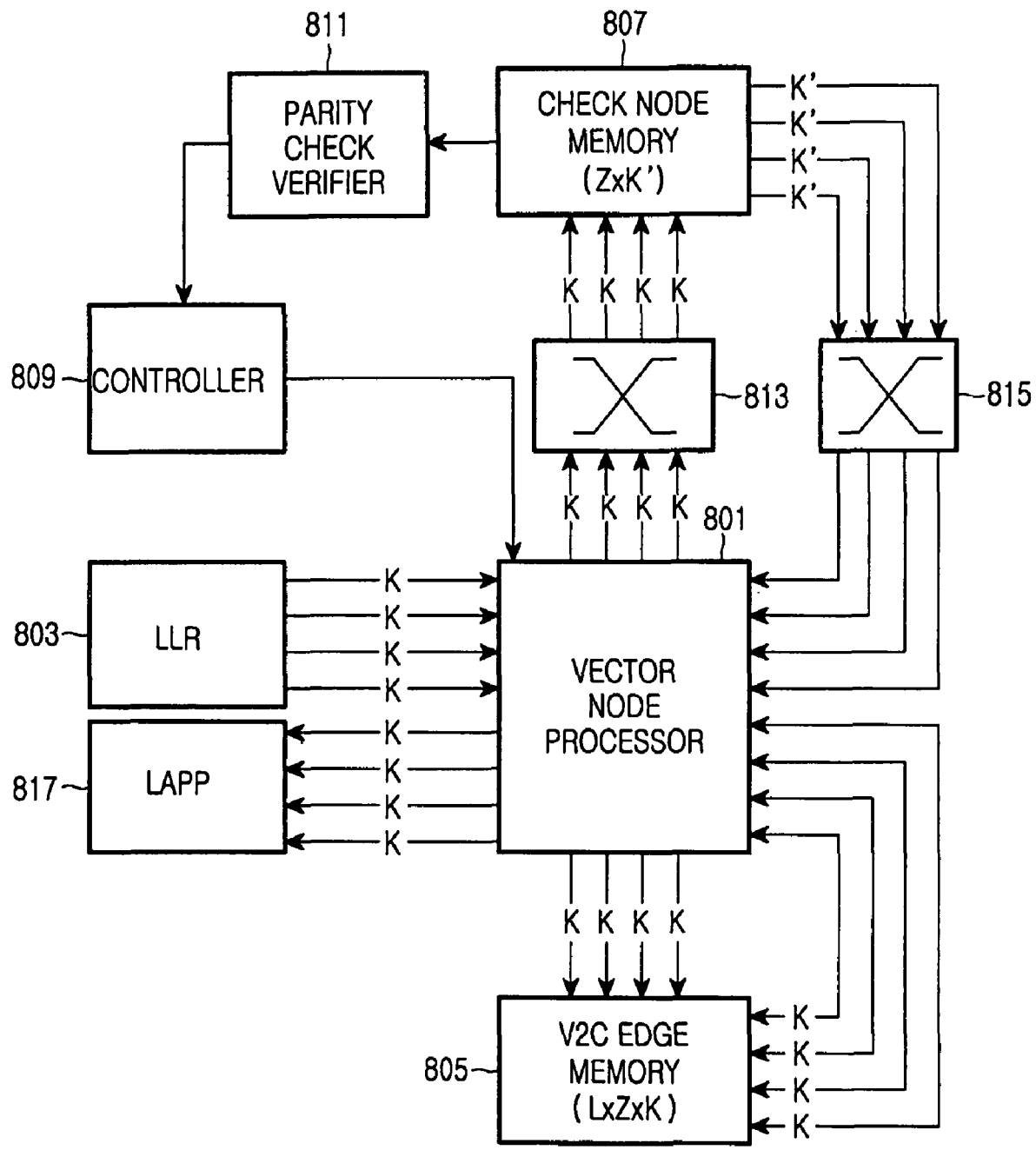
FIG. 8 is a diagram illustrating an structure of a decoder according to the present invention.

FIG. 8 is a diagram illustrating a preferred structure of a decoder according to the present invention. FIG. 8 shows a preferred LDPC decoder with Z=4 parallel factors. It is assumed that the LDPC decoder receives incoming signals from a channel as LLRs with K-bit precision and V2C edge memory values also have the K-bit precision.

Referring to FIG. 8, the LDPC decoder includes a vector node processor 801, an input LLR unit 803 for providing input signals to the vector node processor 801, a V2C edge memory 805 for storing V2C messages among the output messages of the vector node processor 801, a check node memory 807 for storing $p_c$ indicative of an amplitude of node memory values or $q_c$ indicative of a sign of node memory values, a controller 809 for providing a control signal for controlling the vector node processor 801, a parity check verifier 811 for parity-checking outputs of the check node memory 807, a first switch 813 for switching messages output from the vector node processor 801 to the check node memory 807, and a second switch 815 for switching messages output from the check node memory 807 to the vector node processor 801.

The vector node processor 801 performs the node processing processes shown in FIGS. 7A to 7F. The check node memory 807 and the V2C edge memory 805 store messages in order to efficiently use the values exchanged by variable nodes and the check nodes. Therefore, the LDPC decoder reads check node memory values and V2C message values from the check node memory 807 and the V2C edge memory 805, respectively, newly generates V2C messages and check node values $p_c$ and/or $q_c$ through the vector node processor 801, and then stores them in the V2C edge memory 805 and the check node memory 807, respectively.

Commonly, in the block LDPC, the memory read/write operation and the message generation operation can be simultaneously performed in units of Z. Here, the node memory values can have K'-bit precision different from that of V2C messages or that of input LLR values from the LLR unit 803.

For decoding stop in an iteration process, the conventional LDPC decoder checks syndrome using a temporary codeword decoded up to now, at every iteration, or performs decoding up to the maximum iteration. However, in the LDPC decoder, sign $p_c$ (1 bit) and amplitude $q_c$ ((K'-1) bits) of check node memory values are stored in the check node memory 807, and if all $p_c$ values are +1 at every iteration, the LDPC decoder can terminate its decoding operation because it means that all check equations are satisfied.

While the conventional decoder needs the separate parity check verifier 811, the LDPC decoder can simply perform this function by merely checking sign values of the node memory vales, thereby facilitating simple hardware implementation. Therefore, the present invention shown in FIG. 8 can simplify hardware implementation of the parity check verifier 811.

The V2C edge memory 805 is a device for storing L×Z K-bit values, where L denotes the total number of edges in a Tanner graph. In the vector node processor 801, Z variable nodes are parallel-processed, and in a read/write operation on associated edge message values from the V2C edge memory 805, the edge message values can be sequentially processed set by set (each set includes Z edge message values), or edge messages values of several sets can be simultaneously processed.

A structure efficient for the case where the read/write operation is performed simultaneously on edge messages values of several sets, processes as many edge messages values as the number $d_v$ (variable node degree) of edges connected to one variable node. Here, a structure for storing the V2C message or check node values is composed of $d_v$ memory banks.

For an irregular LDPC code, the structure is composed of as many memory banks as the maximum variable node degree. In this case, because check node values associated with edge messages connected to one variable node can be read or written in one cycle, processing on variable nodes of one set is possible using a pipeline structure every cycle. In this manner, it is possible to noticeably improve throughput of the decoder.

The controller 809 designates order of nodes processed by the vector node processor 801, or determines termination of the iterative decoder. The LDPC decoder, as it uses the variable node-based serial scheduling scheme, can designate order of the processed variable nodes using the controller 809.

For example, the LDPC decoder first updates nodes corresponding to information bits, and then updates nodes corresponding to parity bits. On the contrary, for an irregular LDPC code, the LDPC decoder can also determine update order according to node degree. Alternatively, the LDPC decoder can determine update order of the nodes according to a connected configuration of edges.

In FIG. 8, at least one of a switch for block LDPC permutation, i.e. the first and second switches 813 and 815, are located between the vector node processor 801 and the check node memory 807. That is, it would be obvious to those skilled in the art that the apparatuses described with reference to FIGS. 4 and 5 are different in structure from the apparatus, of the present invention as they have a switching device positioned between the vector node processor and the edge memory.

The LDPC decoder in FIG. 8 generates Log-A-Priori Probability (LAPP) 817 as its output, and the LAPP is the sum of all incoming messages of edges connected to each variable node. Because sign of this value indicates a decoded output bit and amplitude of the value indicates decoding reliability, the value can be used for other receiving modules, for example, equalizer, Multi-input multi-output (MIMO) detector, and the like.

Figure 9:
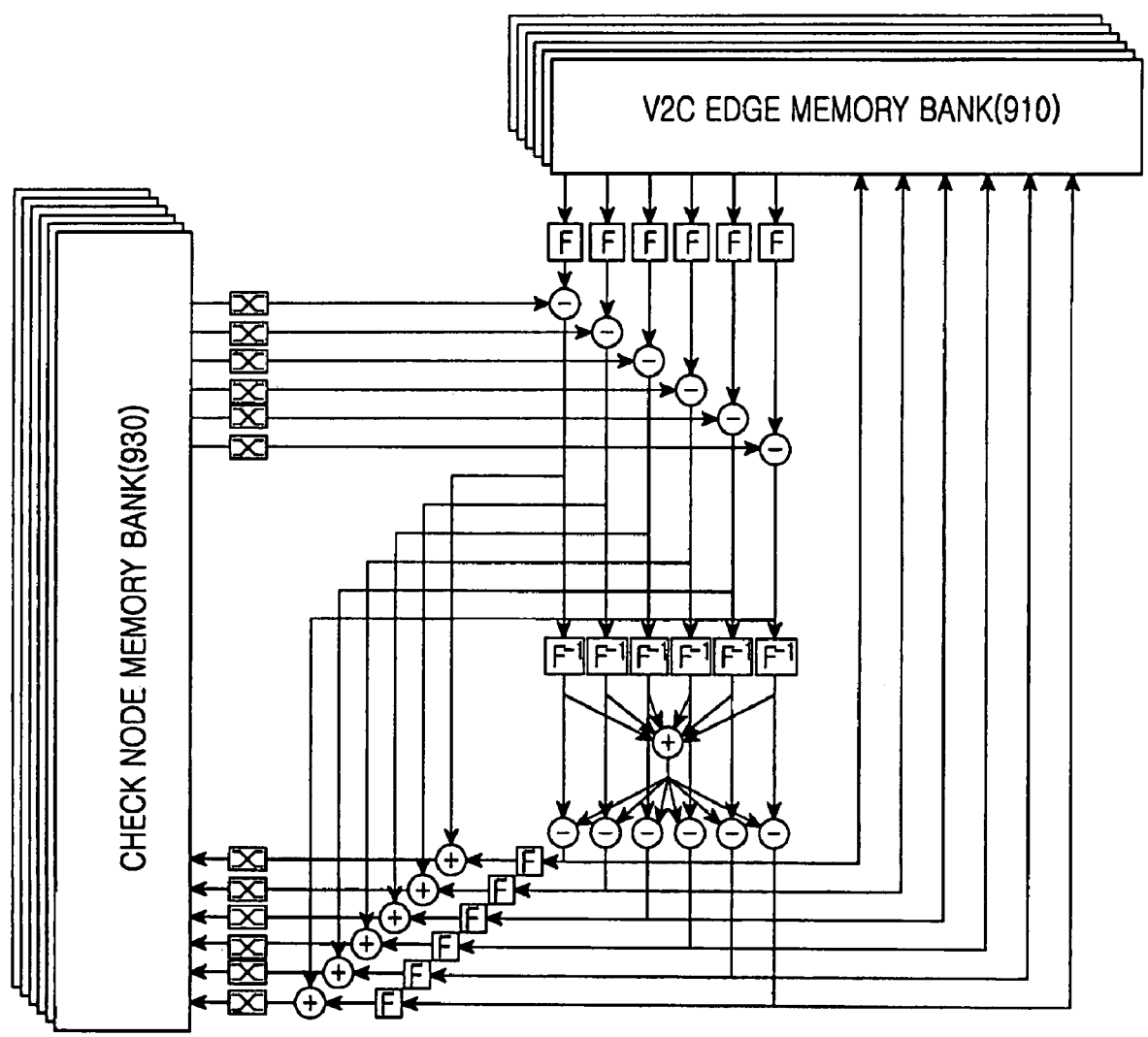
FIG. 9 is a diagram illustrating an internal structure of a node processor according to the present invention.

FIG. 9 is a diagram illustrating an internal structure of a node processor according to the present invention. In particular, FIG. 9 illustrates a structure of a node processor with a memory bank structure according to the present invention. It is assumed herein that the number $d_v$ of edges connected to each variable node is 6 ($d_v$=6).

Referring to FIG. 9, the node processor reads, from a V2C edge memory bank 910 and a check node memory bank 930, edge messages corresponding to the edges connected to the currently processed variable node and values of check nodes connected to the edges, and then performs the foregoing operation thereon.

Subsequently, the newly calculated V2C edge message and check node values are stored again at once, for example, 6 by 6, indicating the number of edges connected to each variable node. In a pipeline structure for increasing decoding throughput, because a timing latch is inserted in the course of a core operation, read and write operations are simultaneously performed in the memory banks.

Because the node processor simultaneously performs read and write operations using a dual-port memory, it controls processing order of nodes such that memory access collision may not occur. In FIG. 9, an F function can be implemented using a look-up table, or several approximation algorithms, for example, min-sum algorithm, linear approximation algorithm, and the like.

As can be understood from the foregoing description, the LDPC decoding apparatus and method can remarkably increase its iteration convergence rate compared with the existing flooding scheduling scheme, and can enable high-rate transmission, which is essential for the next generation mobile communication system. In addition, the LDPC decoding apparatus and method can improve decoding throughput while reducing use of memory.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An apparatus for decoding a Low-Density Parity Check (LDPC) code in a communication system, the apparatus comprising:
   an edge memory for storing a message delivered through an edge between a variable node and a check node;
   a node memory for storing a check node value;
   a node processor performing a node processing operation using information stored in at least one of the node memory and the edge memory, storing a check node value generated by performing the node processing operation in the node memory, and storing a message generated by performing the node processing operation in the edge memory;
   a switch for switching outputs of the node memory and the node processor through a permutation operation;
   a parity check verifier for parity-checking an output from the node memory; and
   a controller for providing a control signal for controlling the node processor.

2. The apparatus of claim 1, wherein the check node value includes at least one of amplitude and sign of a node memory value.

3. The apparatus of claim 2, wherein the amplitude $p_c$ and the sign $q_c$ of the node memory value are expressed as $$m_{v,c}^{VC} \leftarrow y_v, \quad \text{for all } v \text{ and } c \in C(v),$$

$$q_c \leftarrow \sum_{v \in V(c)} F(|m_{v,c}^{VC}|), \quad \text{for all } c$$

-continued $$p_c \leftarrow \prod_{v \in V(c)} sgn(m_{v,c}^{VC}), \text{ for all } c$$

where v and c denote a variable node and a check node, respectively, V(c) denotes an index set of variable nodes adjacent to a $c^{th}$ check node, C(v) denotes an index set of check nodes adjacent to a $v^{th}$ variable node, sgn(x)=−1 for x<0, sgn(x)=+1 for x≧0, and $m_{v,c}^{VC}$ denotes a message delivered from a $v^{th}$ variable node to a $c^{th}$ check node.

4. The apparatus of claim 1, wherein the switch comprises:
a first switch for switching an output from the node processor to the node memory; and
a second switch for switching an output from the node memory to the node processor.

5. The apparatus of claim 1, wherein the switch is located between the node memory and the node processor.

6. The apparatus of claim 1, wherein the node processor generates a C2V message through an operation of the node processor for an edge connected to one predetermined variable node, generates a V2C message connected to the edge of the variable node using the generated C2V message; and sequentially repeats the generation of the V2C message for each individual variable node.

7. The apparatus of claim 1, wherein the LDPC decoding apparatus determines an update scheme of messages stored in the node memory and the edge memory depending on a node-based serial scheduling scheme.

8. The apparatus of claim 1, wherein the LDPC decoding apparatus terminates a decoding operation if the node memory value is +1.

9. The apparatus of claim 1, wherein the node memory is different in bit precision from a variable node outgoing message and an input Log-Likelihood Ratio (LLR) value.

10. The apparatus of claim 1, wherein the parity check verifier verifies an output of the node memory by checking a sign value of the node memory value.

11. The apparatus of claim 1, wherein at least one of the node memory and the edge memory is formed of a memory bank.

12. The apparatus of claim 11, wherein a number of the memory banks is a maximum variable node degree.

13. The apparatus of claim 1, wherein at least one of the node memory and the edge memory is connected in a pipeline structure and updates one set every cycle.

14. The apparatus of claim 1, wherein the control signal comprises at least one of a designation signal for designating order of the node and a termination signal of the decoding.

15. The apparatus of claim 14, wherein the designation signal comprises at least one of a signal for determining update order according to node degree, and a signal for determining update order of the nodes according to connected configuration of the edges.

16. The apparatus of claim 1, wherein a message updated at the node and the edge comprises previously updated edge and node messages.

17. An apparatus for decoding a Low-Density Parity Check (LDPC) code in a communication system, the apparatus comprising:
a node memory for storing a check node value;
a node processor for performing a node processing operation, and generating a check node value stored in the node memory according to the node processing operation;
a switch located between the node memory and the node processor, for switching outputs of the node memory and the node processor through a permutation operation; and
an edge memory for storing a message delivered through an edge between a variable node and a check node,
wherein the node processor performs a node processing operation using information stored in at least one of the node memory and the edge memory, stores a check node value generated by performing the node processing operation in the node memory, and stores a message generated by performing the node processing operation in the edge memory.

18. The apparatus of claim 17, further comprises:
a switch for switching outputs of the node memory and the node processor through a permutation operation;
a parity check verifier for parity-checking an output from the node memory; and
a controller for providing a control signal for controlling the vector node processor.

19. The apparatus of claim 17, wherein the check node value includes at least one of amplitude and sign of a node memory value.

20. The apparatus of claim 19, wherein the amplitude $p_c$ and the sign $q_c$ of the node memory value are expressed as $$m_{v,c}^{VC} \leftarrow y_v, \text{ for all } v \text{ and } c \in C(v),$$

$$q_c \leftarrow \sum_{v \in V(c)} F(|m_{v,c}^{VC}|), \text{ for all } c$$

$$p_c \leftarrow \prod_{v \in V(c)} sgn(m_{v,c}^{VC}), \text{ for all } c$$

where v and c denote a variable node and a check node, respectively, V(c) denotes an index set of variable nodes adjacent to a $c^{th}$ check node, C(v) denotes an index set of check nodes adjacent to a $v^{th}$ variable node, sgn(x)=−1 for x<0, sgn(x)=+1 for x≧0, and $m_{v,c}^{VC}$ denotes a message delivered from a $v^{th}$ variable node to a $c^{th}$ check node.

21. The apparatus of claim 17, wherein the switch comprises:
a first switch for switching an output from the node processor to the node memory; and
a second switch for switching an output from the node memory to the node processor.

22. The apparatus of claim 17, wherein the node processor generates a C2V message through an operation of the node processor for an edge connected to one predetermined variable node, and generates a V2C message connected to the edge of the variable node using the generated C2V message; and
the node processor sequentially repeats the generation of the V2C message for each individual variable node.

23. A method for decoding a Low-Density Parity Check (LDPC) code in a communication system, the method comprising:
initializing a variable node, a check node and an edge;
updating at least one message among messages of the nodes and the edge, with previously updated edge and node message values; and
storing the updated edge message or the updated node message,
wherein the initialization comprises:

acquiring a message value of edges connected to a variable node;

generating a check node outgoing message with the acquired message value; and generating a variable node outgoing message using the check node outgoing message.

24. The method of claim 23, wherein the updating comprises determining an update scheme of messages stored in a node and an edge memory depending on a node-based serial scheduling scheme.

25. The method of claim 23, wherein the node message is different in bit precision from the outgoing message and an input Log-Likelihood Ratio (LLR) value.

26. The method of claim 25, wherein at least one of the memory storing the node message and the memory storing the edge message is formed of a memory bank.

27. The method of claim 26, wherein a number of the memory banks is a maximum variable node degree.

28. The method of claim 23, wherein at least one of the memory storing the node message and the memory storing the edge message is connected in a pipeline structure and updates one set every cycle.

29. The method of claim 23, further comprising terminating a decoding operation if the memory value is +1, wherein the memory stores the node message.

30. The method of claim 23, further comprising:

verifying a sign value of the node message; and generating a control signal for controlling update order of the node and the edge according to the sign value.

31. The method of claim 23, wherein the control signal comprises at least one of a designation signal for designating order of the node and a termination signal of the decoding.

32. The method of claim 31, wherein the designation signal comprises at least one of a signal for determining update order according to node degree, and a signal for determining update order of the nodes according to connected configuration of the edges.

33. The method of claim 23, wherein a message updated at the node and the edge comprises previously updated edge and node messages.

* * * * *